(12) United States Patent
Stice

(10) Patent No.: US 6,744,390 B1
(45) Date of Patent: Jun. 1, 2004

(54) ANALOG TO DIGITAL CONVERTER UTILIZING RESOLUTION ENHANCEMENT

(75) Inventor: John R. Stice, Redmond, WA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/541,460

(22) Filed: Mar. 31, 2000

(51) Int. Cl.⁷ .............................. H03M 1/10; H03M 1/12
(52) U.S. Cl. ....................................... 341/120; 341/155
(58) Field of Search ....................... 341/120, 131, 341/139, 155

(56) References Cited

U.S. PATENT DOCUMENTS

| | | | |
|---|---|---|---|
| 3,713,023 A | 1/1973 | Metcalf et al. | 341/127 |
| 3,790,947 A | 2/1974 | Campbell et al. | 341/131 |
| 3,792,352 A | 2/1974 | Metcalf et al. | 341/127 |
| 3,877,022 A | 4/1975 | Lehman et al. | 341/131 |
| 4,183,016 A | 1/1980 | Sawagata | 341/122 |
| 4,736,189 A * | 4/1988 | Katsumata et al. | 341/120 |
| 5,250,948 A | 10/1993 | Berstein et al. | 341/131 |
| 5,608,399 A | 3/1997 | Coleman, Jr. | 341/139 |
| 5,612,698 A * | 3/1997 | Reay | 341/155 |
| 5,812,077 A * | 9/1998 | Boie | 341/120 |
| 6,081,215 A * | 6/2000 | Kost et al. | 341/120 |
| 6,215,433 B1 * | 4/2001 | Sonu et al. | 341/120 |

* cited by examiner

*Primary Examiner*—Trong Phan
(74) *Attorney, Agent, or Firm*—Conrad O. Gardner

(57) ABSTRACT

An analog to digital converter for input signals having a low frequency component (such as DC) upon which is superimposed an AC component, the magnitude of the AC component being less than or equal to one-half the span of the analog to digital converter.

5 Claims, 5 Drawing Sheets

ANALOG TO DIGITAL CONVERTER UTILIZING RESOLUTION ENHANCEMENT

STATEMENT AS TO RIGHTS TO INVENTIONS MADE UNDER FEDERALLY SPONSORED RESEARCH AND DEVELOPMENT

This invention was made with U.S. Government support under F 30602-97-2-0099, Program Designation 950. The U.S. Government has certain rights to this invention.

BACKGROUND OF THE INVENTION

1. Field of the Invention

The invention relates to analog to digital converters and more specifically, to an analog to digital converter providing resolution enhancement utilizing a reduced span analog to digital converter.

2. Description of the Related Art

General Background

Analog to digital converters are circuit blocks which convert a span of analog voltages to digital numbers. It is customary to characterize this digital number, and consequently, the converter's resolution by the number of bits it contains.

As a first example, if the digital output is composed of eight bits, the output number can take on any of $2^8=256$ values. The analog input span's dynamic range is thus considered to be divided into 256 discrete quanta for an eight bit converter.

As a second example, if the output is composed of 10 bits, the output number can take on any of $2^{10}=1024$ values. The analog input span's dynamic range is thus considered to be divided into 1024 discrete quanta for a 10 bit converter.

The mathematical reason for this is that a single bit represents two states, customarily referred to as a "1" and a "0". If there are eight bits, the total number of combinations of "1s" and "0s" is $2^8$.

Input signals exceeding the converter's input span (also referred to as its dynamic range) typically result in undefined behavior.

The complexity of an analog to digital converter is strongly related to the number of bits it can provide: In general, the more bits which are required, the more complex the converter is. Converter complexity adversely influences its cost and development schedule. From a cost and schedule perspective, it is desirable to develop a converter having only a small number of bits. Unfortunately, many applications require high resolution to meet overall system requirements. This may force a resultant complexity onto the analog to digital converter.

The hereinafter described invention offers a means of compromise between converter resolution (the number of bits) and converter complexity.

3. Statement of the Problem

Analog to digital converters having relatively high resolution are often needed to satisfy a system's requirements. Some circumstances allow the converter to be replaced by a special input preamplifier and a simpler converter, one providing few bits. This lowers overall circuit design complexity. The reduction in number of converter bits is compensated for by offset voltages applied to a special input amplifier.

Alternate and Prior Solutions to the Problem
High Resolution Conversion

The straightforward solution to the problem of digitizing at high resolution is to use a high resolution analog to digital converter. This technique is illustrated in FIG. 1 of the drawing.

FIG. 1 shows as an example the transfer function of a system whose analog to digital converter's input span matches the system's full input signal range. To achieve this match, the input signal was appropriately amplified as shown. In this example, the signal source input is plotted along the horizontal axis and extends between values of −0.01 and +0.1. This input signal is amplified by a conventional analog circuit to provide an output signal extending between values of −4 and +4. This amplified output signal is applied to the analog to digital converter's input. The converter's input span is typically designed to coincide with the full range of the amplified signal thereby taking advantage of the analog to digital converter's entire dynamic range. The converter's span as shown in the figure extends across the entire vertical axis of the figure.

If the system requirements state, for example, the input signal must be resolved to one part in 10,000, then a converter having at least 14 bits is required. Thirteen bits is insufficient as the following computations illustrate:

$2^{13}=8192$ The number of values a 13 bit converter can resolve.

$2^{14}=16,384$ The number of values a 14 bit converter can resolve.

Since the required resolution is greater than that offered by a 13 bit converter, an additional $14^{th}$ bit is required. This greatly complicates the converter's design.

Low-Resolution, Over-Sampled Converters ("Sigma-Delta" Converters)

A second means of utilizing low resolution converters for precision measurements is to sample the input signal at a high rate with the low-resolution converter. The digital output of the converter is reconstructed into an analog signal; also at the high rate. The reconstructed analog signal is compared with the original analog signal using a precision comparator circuit. If the reconstructed signal is higher than the input, the digital output of the converter is mathematically reduced and the reduced value converted to an analog value which is again compared to the input signal. This process continues until the reconstructed signal is smaller than the input. The reconstructed signal is then mathematically incremented until it is again larger than the input.

This has the effect of causing the reconstructed analog voltage to lock onto the input voltage in a servo-loop fashion. The mathematically determined values are applied to a digital filter whose output, at a much slower rate, is a precision digital representation of the input signal.

These types of converters are referred to as "sigma-delta" converters and can provide high performance. For example, an analog to digital converter consisting of a single bit can be used to provide a conversion whose resolution can exceed 20 bits.

A disadvantage of these converters is they cannot easily track rapidly changing input signals. It is easy for their servo-lock on the input signal to become broken if the slew rate of the input signal exceeds a fixed amount.

Patent Literature

U.S. Pat. No. 4,183,016, Sawagata, "Parallel Analog-To-Digital Converter With Increased Resolution"

This patent utilizes an offset reference voltage to reduce the level of the input signal. However, this patent reduces the input signal by only a single, least significant bit, which is then added on to the converted signal. In contrast, the present AD converter system separately converts a reference voltage, comprised of potentially more than a least significant bit. This voltage is then subtracted from the input voltage, which is then converted. The converted reference voltage is then added to the converted reduced input voltage. The present invention allows for a greater improved resolution, for input signals which have a large DC level imposed on a small AC signal.

U.S. Pat. No. 5,250,948, Berstein et al., "High Level Resolution Enhancement for Dual-Range A/D Conversion"

This patent discloses a dual range A/D in which there are two possible signal paths. If the input signal is small, then the first path, which contains an input amplification, is used. If the input signal is large, the second path, which contains unity gain, is used. In contrast, the present AD converter system utilizes a single input path in which the input is reduced by an offset voltage to eliminate any DC component of the signal. The preconverted offset is then added to the signal conversion to provide the conversion of the full input signal.

U.S. Pat. No. 5,608,399, Coleman, Jr., "Resolution Enhancer Circuit for Analog to Digital Conversion"

This patent provides conversion to a wide ranging analog input signal. If the signal exceeds the limit of the A/D, then the input is scaled down. If the input is much less than the range of the A/D, then the input is scaled up. The difference between the prescaled and scaled signal is separately input to the A/D to provide the final converted output. In contrast, the present AD converter system is directed to only eliminating the DC component and input signal, to allow for higher resolution of the AC component. The DC component is separately digitized and added to the AC converted output.

BRIEF SUMMARY OF THE INVENTION

The present AD converter system concerns those signals which have a low frequency component (such as DC) superimposed upon an AC component. The magnitude of the AC component must be less than or equal to one-half the span of the converter. The majority of signal transducers, such as pressure to voltage converters, satisfy this requirement. For these signals, the present invention provides a high resolution ADC with the simplicity advantage inherent in a reduced resolution ADC. This is accomplished by first connecting the input signal through a programmed gain preamplifier. The preamplifier matches the full range of the ADC to only the AC component portion of the input signal. In order to cover the entire input signal, the ADC's range is complemented by an offset value. The advantage of this technique is the preamplifier, designed to amplify the input signal at high gain, while applying the offset value at low gain. A digital summing junction combines the analog to digital conversion results with the offset value, resulting in a higher precision overall conversion.

DETAILED DESCRIPTION OF THE INVENTION

Reduced Span Analog to Digital Converter

Figure 2:
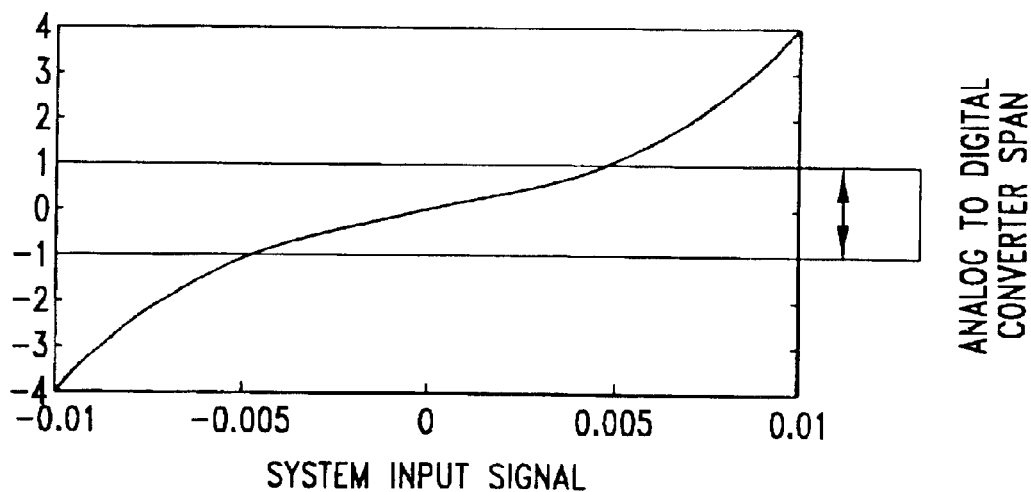
FIG. 2 is an example of a system having a partial-span analog to digital converter. The shaded region is the converter's span.

To attain the simplicity advantage inherent in a reduced-resolution analog to digital converter, such a device is first connected to the input signal through a programmed gain preamplifier. FIG. 2 shows the result of applying an input signal through such an amplifier to the analog to digital converter.

Figure 1:
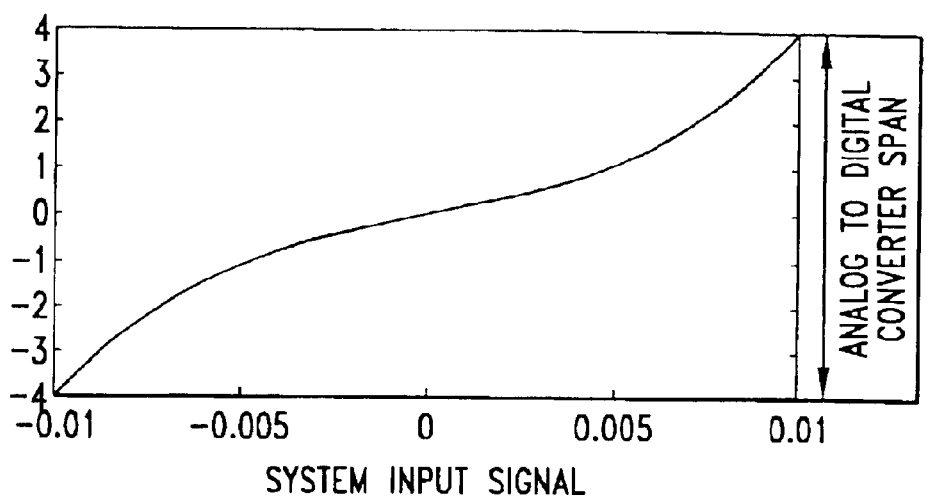
FIG. 1 is an example of a system having a full-scale analog to digital converter. The vertical axis is the input span of the analog to digital converter.

The programmed gain preamplifier matches the span of the analog to digital converter against only a portion of the system input, as illustrated by the example of FIG. 2. The analog to digital converter's span covers only system inputs ranging between −0.005 to +0.005. By way of example, this corresponds to ¼ the span of the converter described in FIG. 1. It is important to note however, that if the analog to digital converter represented in FIG. 2 has ¼ the resolution of the converter represented in FIG. 1, both converters can resolve the limited span between −0.005 and +0.005 to the same resolution.

Offset Steps

Figure 3:
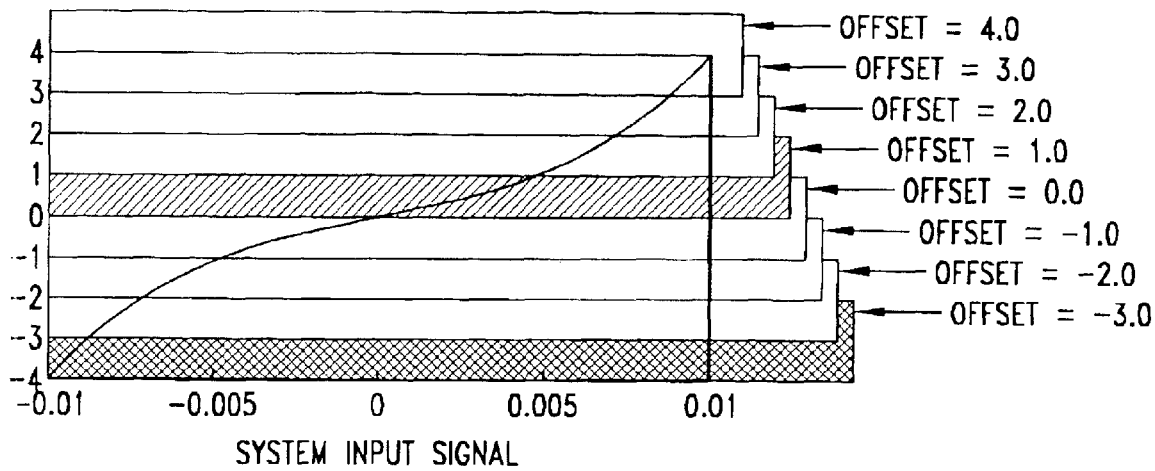
FIG. 3 is an example of a system having a partial-scale analog to digital converter whose spans are offset as needed to digitize the entire input signal.

The entire input signal range, from −0.01 to +0.01 in the example of FIG. 2, still requires coverage, however. This requirement can be met by vertically positioning the converter's span by means of an offset value. FIG. 3 shows this effect.

In FIG. 3, the span of the analog to digital converter is displaced along the vertical axis to one of eight overlapping positions. These are shown in the figure as shaded bands. The width of each band represents the analog to digital converter's span.

It can be appreciated from the figure that an advantage of this technique is that the preamplifier is designed to amplify the input signal at high gain while applying the offset value at low gain. The offset value thus requires a system level accuracy corresponding to the preamplifier's low gain value for offset divided by its high gain value for signals.

As will be described, a digital summing junction arrangement combines the analog to digital conversion results with the offset value, resulting in a higher precision overall conversion.

Offset Overlap

The offset bands illustrated in FIG. 3 are chosen to overlap, thereby providing hysteresis: The offset, once stepped to a new value, consequently need not be stepped back to its previous value should the input signal change back to a value covered by the previous band. This is necessary to accommodate signals having an oscillatory component.

Input Signal Limitations

As can be appreciated, input signals suitable for digitization by this technique are limited to those consisting of a low-frequency component (such as DC) upon which is superimposed an AC component. The magnitude of the AC component must be less than or equal to one-half the span of the converter. The majority of signal transducers, such as pressure to voltage converters, satisfy this requirement.

Figure 4:
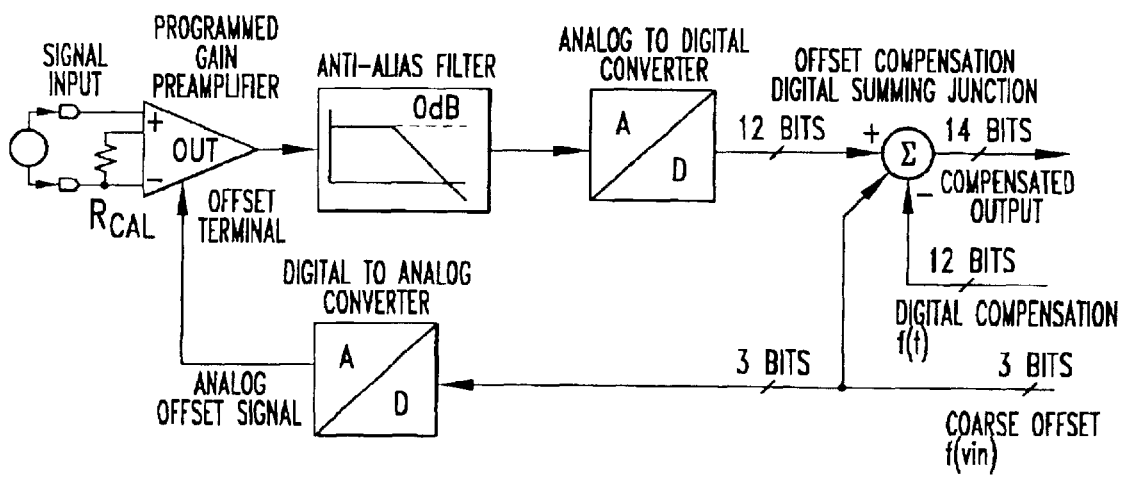
FIG. 4 is a block diagram of an analog to digital converter system according to an embodiment of the invention.

Turning now to FIG. 4, the system diagram of the present invention includes the following components:

1. Programmable gain preamplifier
2. Offset compensation digital summing junction Other important components of the invention which are well known to practitioners of the art are:

1. Anti-alias filter
2. Analog to digital converter
3. Digital to analog converter

Programmed Gain Preamplifier

Figure 5:
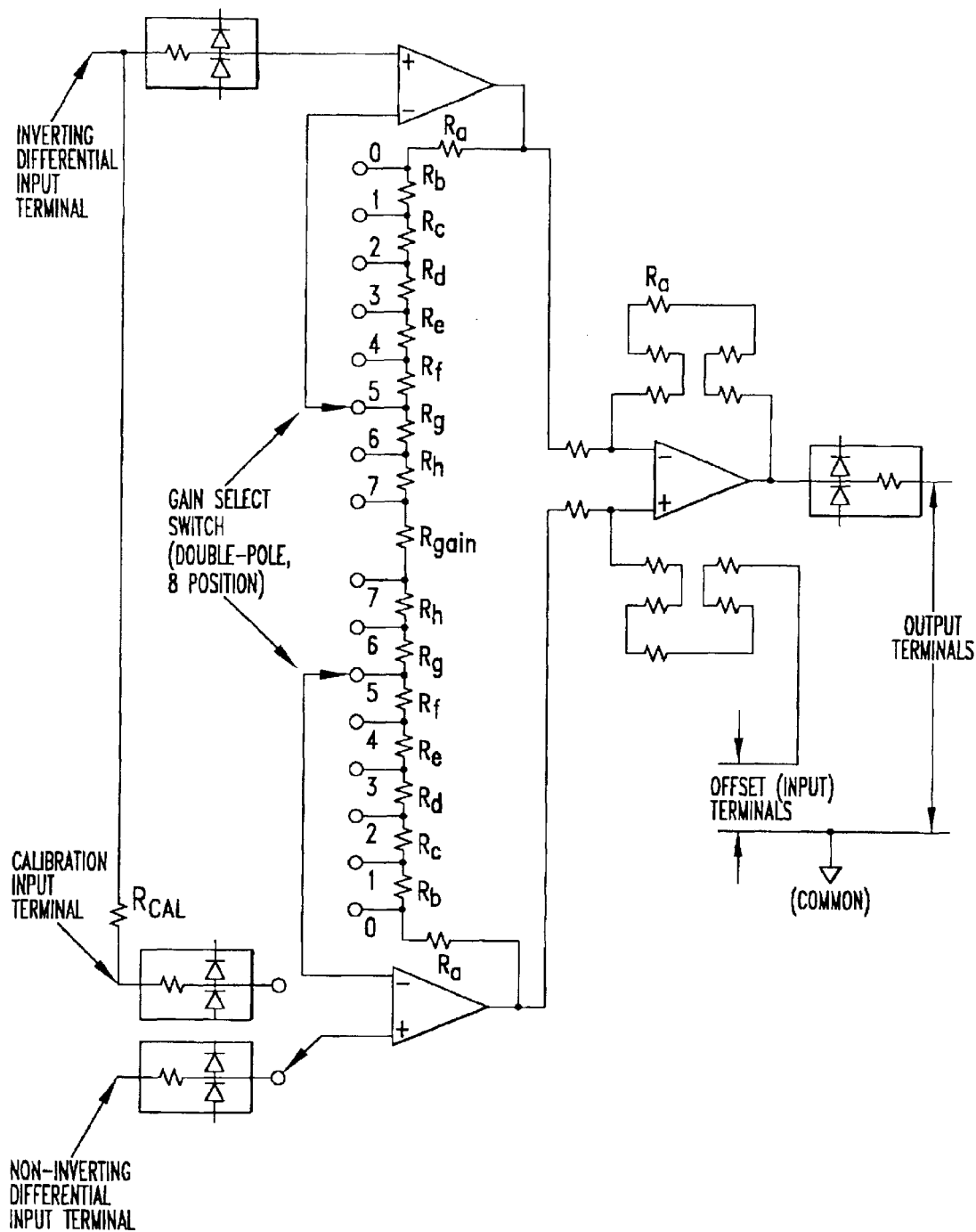
FIG. 5 is a circuit diagram of a programmable gain preamplifier having adjustable offset in accordance with an embodiment of the invention.

The programmed gain preamplifier as shown in FIG. 5 provides a high differential gain for the input signal and a low single-ended gain for the offset signal.

This circuit has two differential inputs and one single-ended input. The first of the two differential inputs is for signal and the second is for calibration. The signal input is applied differentially between the terminals labeled "Non-Inverting Differential Input" and "Inverting Differential Input". Calibration uses the terminals labeled "Calibration Input" and "Inverting Differential Input". FIG. 5 shows the resistor "$R_{CAL}$" connected between the calibration inputs. Note that the terminal labeled "Inverting Differential Input" is used for one side of both differential inputs. The single-ended input is applied to the terminal labeled "Offset (Input) Terminal".

In the circuit of FIG. 5, the input differential gain is determined by a double-pole, eight position switch: Position 0 is the lowest gain position and position 7 is the highest gain position. It should be understood that the switches in the illustrated circuit can be mechanical, as shown, or can be electronic. Either implementation is suitable.

The signal appearing on the "Output Terminal" is the electrical sum of the input (either the differential input signal or calibration, depending upon which is selected) times the amplifier's gain plus the voltage appearing on the "Offset Terminal" times a gain of 1.

Offset Generation

The voltage applied to the Offset (Input) Terminal shown in FIG. 5 is provided by a digital to analog converter. In the block diagram of FIG. 4, this circuit is labeled "Digital to Analog Converter" and is shown connected to the preamplifier's offset terminal.

Calibration

Calibration of the present analog to digital converter system insures accuracy. Calibration can be implemented under microprocessor control (not shown) although other means such as a digital state machine may also be used.

Calibration for each of the offset values shown in FIG. 3 is required. This entails first switching the programmable gain preamplifier of FIG. 5 across the calibration resistor. This applies the equivalent of zero volts to the preamplifier's input so that any voltage appearing at its output is due entirely to preamplifier error voltages summed with voltages on its offset terminal. The first value of offset is then applied to the offset terminal. The resulting waveform is digitized by the 12-bit analog to digital converter and is stored in memory.

The stored waveform is the calibration waveform for use when the offset is switched from zero to the first value of offset. This waveform is to be subtracted from the output signal whenever the offset is switched from zero to the first value of offset.

This process is repeated as the offset is switched from its first value to its second value to create a second calibration waveform. The process is repeated for each of the offset transitions between adjacent values of offset, both up and down, resulting in 14 different calibration waveforms.

The appropriate calibration waveform is to be subtracted on a sample-by-sample basis whenever the offset value steps from one band to the next. The calibration waveform must be applied synchronously with the offset step, in the aforementioned digital manner, to the digital subtraction process.

Figure 6:
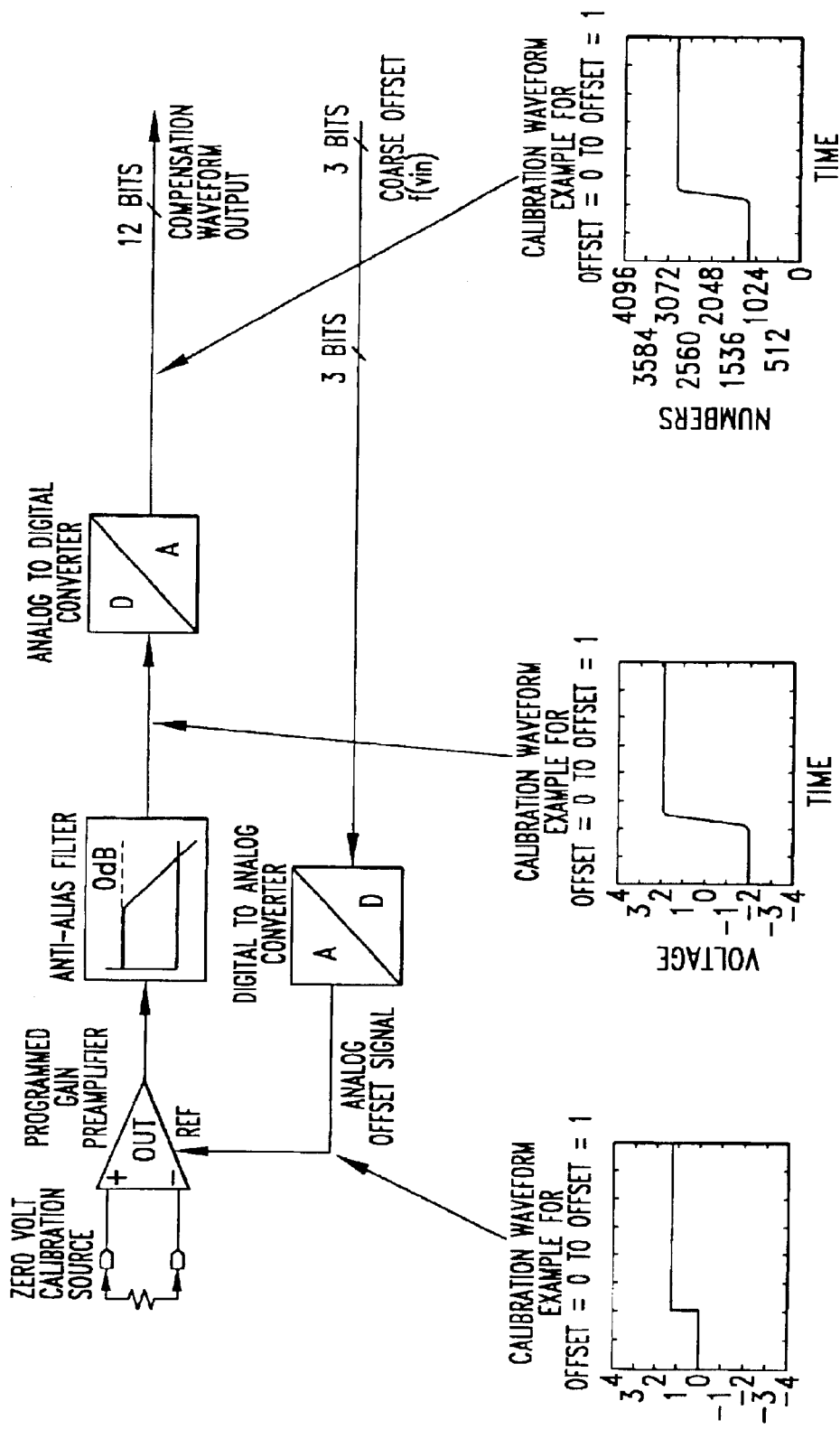
FIG. 6 is a block diagram of the calibration process of the AD converter system in accordance with an embodiment of the invention.

FIG. 6 is a block diagram of this process for the generation of one calibration waveform. The waveforms shown are plots of voltages or numeric values vs. time.

Example

Figure 7:
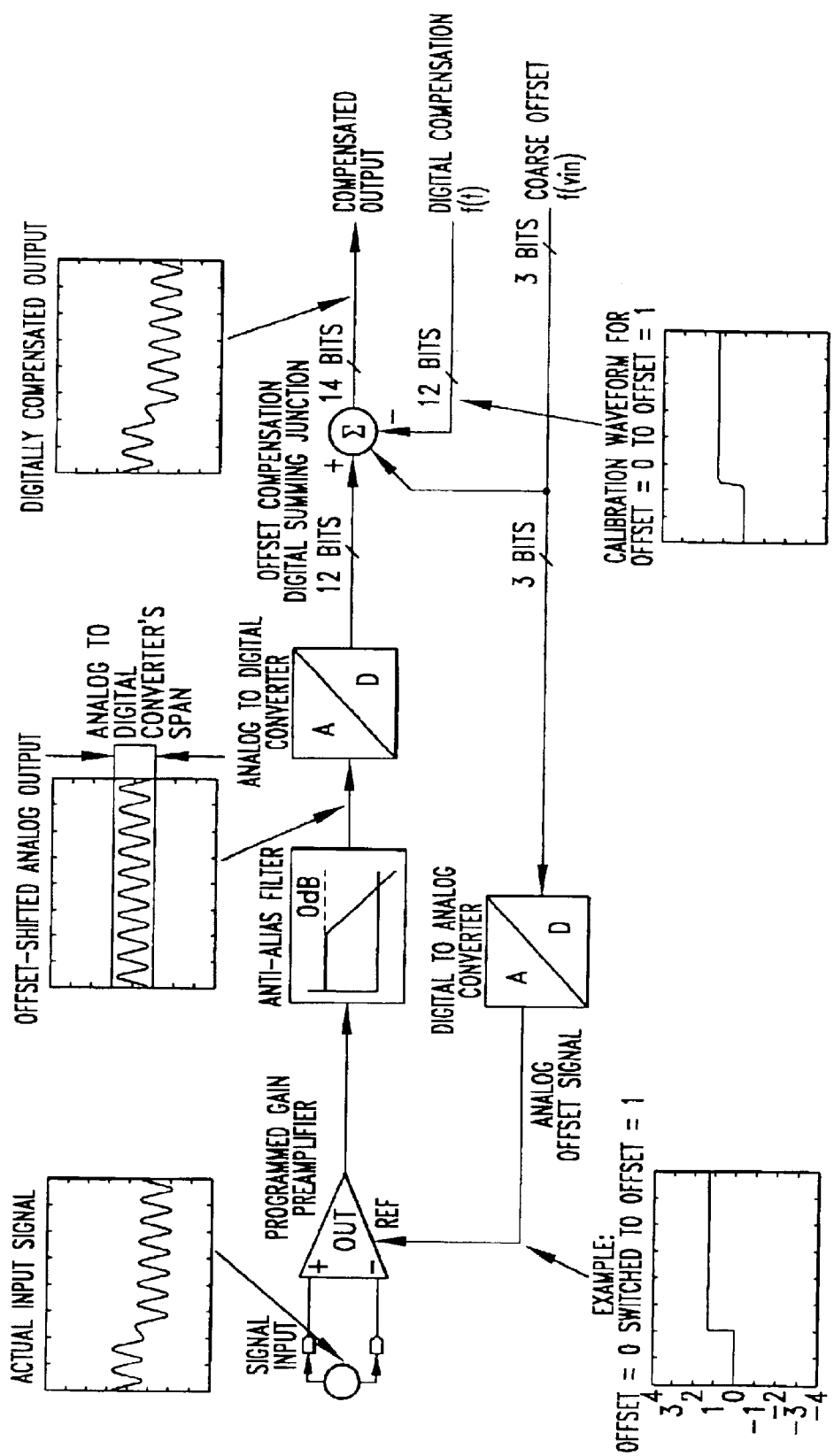
FIG. 7 is a block diagram of the present AD converter system showing waveshapes during operation of the system.

FIG. 7 is deemed helpful in showing how the invention operates on an example signal and includes corresponding waveforms. It should be appreciated that the input signal shown in the figure is but one example of many possible.

As shown in FIG. 7, the example analog input signal to the programmable gain preamplifier is a sine wave whose offset shifts in a negative direction after approximately one-third of the time plotted along the horizontal axis. The span of the analog to digital converter is insufficient to cover the entire vertical dimensions of the waveform.

An offset signal, as shown in the figure, is applied to the preamplifier to keep the signal within the span capability of the analog to digital converter. The output of the anti-aliasing filter consequently remains within the span of the converter.

The output of the analog to digital converter is processed digitally with one of the calibration waveforms as hereinbefore described to yield a higher-resolution, digital version of the original waveform as shown in FIG. 7.

It can be appreciated from both FIG. 6 and FIG. 7 as hereinbefore described, that calibration waveforms accommodate the anti-alias filter's frequency response. As a step signal, such as the one arising from the application of an offset signal to the preamplifier, is applied to a low-pass anti-alias filter, the output of the filter has a finite rather than instantaneous rise time. This somewhat gradual transition is subtracted out since it is a replica of the waveform originally obtained during calibration.

What is claimed is:

1. An analog to digital converter resolution enhancement method comprising the steps of:

providing an analog to digital converter having an AC component less than or equal to one-half the full range of signals which the analog to digital converter itself can accommodate;

connecting the input signal to the input of a programmed gain preamplifier;

utilizing said programmed gain preamplifier to match the full range of said analog to digital converter to said AC component of the input signal; and then, enhancing the analog to digital conversion range of said analog to digital converter by an offset value thereby causing said programmed gain preamplifier to amplify the input signal at high gain while applying the offset value at low gain.

2. An analog to digital converter having resolution enhancement comprising in combination:

an analog to digital converter having a full range and an input terminal and an output terminal;

a programmed gain preamplifier having an input terminal for receiving an input signal having an AC component portion and an output terminal coupled to the input terminal of said analog to digital converter;

said programmed gain preamplifier matching said full range of said analog to digital converter to only said AC component portion of the input signal;

said analog to digital converter having a range complemented by an offset value; and a summing junction for combining the output of said analog to digital converter with said offset value thereby causing said programmed gain preamplifier to amplify the input signal at high gain while applying the offset value at low gain.

3. In combination:

a reduced span analog to digital converter;

a programmed gain preamplifier coupled between an input terminal for receiving an input signal and said reduced span analog to digital converter;

said programmed-gain preamplifier having a high differential gain for said input signal and a low single-ended gain for the offset signal;

said programmed gain preamplifier matching the range of signals which said analog to digital converter can fully accommodate against only a portion of the signal present at the circuit's input; and, the entire range of signals provided by positioning the analog to digital converter's input signal range by means of an offset value.

4. In combination:

an analog to digital converter having an input terminal and an output terminal;

a programmed gain preamplifier having an input terminal for receiving an input signal, an offset terminal, and an output terminal;

a digital summing junction;

said output terminal of said analog to digital converter coupled to said digital summing junction;

an anti-alias filter having an input terminal and an output terminal;

said output terminal of said anti-alias filter coupled to said input of said analog to digital converter;

said input terminal of said anti-alias filter coupled to said output terminal of said programmed gain preamplifier; and, said digital to analog converter coupled between said digital summing junction and said offset terminal of said programmed gain preamplifier for providing an analog offset signal to said programmed gain preamplifier.

5. The combination:

an analog to digital converter having an input terminal and an output terminal;

a programmed gain preamplifier having an input terminal for receiving an input signal, an offset terminal, and an output terminal;

a digital summing junction;

said output terminal of said analog to digital converter coupled to said digital summing junction;

an anti-alias filter having an input terminal and an output terminal;

said output terminal of said anti-alias filter coupled to said input of said analog to digital converter;

said input terminal of said anti-alias filter coupled to said output terminal of said programmed gain preamplifier;

said digital to analog converter coupled between said digital summing junction and said offset terminal of said programmed gain preamplifier for providing an analog offset signal to said programmed gain preamplifier; and, wherein said programmed gain preamplifier provides a high differential gain for said input signal and a low single-ended gain for said analog offset signal.

* * * * *